(12) United States Patent
Lee

(10) Patent No.: US 11,653,443 B2
(45) Date of Patent: May 16, 2023

(54) FLEXIBLE POLYMERIC FILM INCLUDING REINFORCEMENT LAYER

(71) Applicant: Nova Engineering Films, Inc., Los Altos Hills, CA (US)

(72) Inventor: Sang In Lee, Los Altos Hills, CA (US)

(73) Assignee: Nova Engineering Films, Inc., Los Altos Hills, CA (US)

( * ) Notice: Subject to any disclaimer, the term of this patent is extended or adjusted under 35 U.S.C. 154(b) by 245 days.

(21) Appl. No.: 17/212,986

(22) Filed: Mar. 25, 2021

(65) Prior Publication Data

US 2021/0219421 A1    Jul. 15, 2021

Related U.S. Application Data

(62) Division of application No. 16/687,509, filed on Nov. 18, 2019, now Pat. No. 10,993,318.

(Continued)

(51) Int. Cl.
    *H05K 1/02*      (2006.01)
    *H05K 1/03*      (2006.01)
    (Continued)

(52) U.S. Cl.
    CPC ..... *H05K 1/0281* (2013.01); *G02F 1/133305* (2013.01); *H01L 51/0097* (2013.01); *H05K 1/0393* (2013.01); *H05K 1/118* (2013.01)

(58) Field of Classification Search
    CPC .... H05K 1/0281; H05K 1/0393; H05K 1/118; G02F 1/133305

(Continued)

(56) References Cited

U.S. PATENT DOCUMENTS 5,321,553 A * 6/1994 Ishiyama ............. G02B 15/177
                                                    359/691
5,999,335 A * 12/1999 Koyama ............... H04N 9/3105
                                                    349/8

(Continued)

FOREIGN PATENT DOCUMENTS

KR    10-2019-0063470 A    6/2019
WO    WO 2017/161919        9/2017

(Continued)

OTHER PUBLICATIONS

PCT International Search Report and Written Opinion, PCT Application No. PCT/US19/62458, dated Feb. 3, 2020, 16 pages.

(Continued)

*Primary Examiner* — Tahseen Khan
(74) *Attorney, Agent, or Firm* — Fenwick & West LLP

(57) ABSTRACT

A flexible polymeric film includes a reinforcement layer and a base layer. The reinforcement layer includes a lamella and a plurality of columns. The columns are on a surface of the lamella. Each of the columns extends in a direction and is separated from a neighboring column by a gap. The base layer is coupled to the columns and portions of the surface of the lamella in the gaps between the columns. The base layer is less rigid than the reinforcement layer. The flexible polymeric film can be produced by spraying a precursor onto a substrate. A layer of the precursor is formed on the substrate and exposed to an energy beam to form a preliminary film on the substrate. The columns can be formed from a plurality of portions of the preliminary film. The lamella is formed on top of the preliminary film that is formed with the columns.

20 Claims, 11 Drawing Sheets

Related U.S. Application Data

(60) Provisional application No. 62/798,974, filed on Jan. 30, 2019, provisional application No. 62/771,064, filed on Nov. 24, 2018.

(51) Int. Cl.
  *H05K 1/11* (2006.01)
  *G02F 1/1333* (2006.01)
  *H01L 51/00* (2006.01)

(58) Field of Classification Search
  USPC .......................................... 174/254; 428/156
  See application file for complete search history.

(56) References Cited

U.S. PATENT DOCUMENTS

| | | | | |
|---|---|---|---|---|
| 6,020,999 | A * | 2/2000 | Hasegawa | G02B 26/106 |
| | | | | 359/566 |
| 6,392,787 | B1 | 5/2002 | Cirelli et al. | |
| 7,767,589 | B2 | 8/2010 | Bedinger et al. | |
| 9,090,004 | B2 | 7/2015 | Kuczynski et al. | |
| 9,608,017 | B2 * | 3/2017 | Shieh | H01L 29/78669 |
| 2002/0171815 | A1 * | 11/2002 | Matsuyama | G03F 7/70308 |
| | | | | 356/399 |
| 2004/0080799 | A1 * | 4/2004 | Ishihara | G02B 26/101 |
| | | | | 359/202.1 |
| 2004/0201902 | A1 * | 10/2004 | Mihara | G02B 15/144515 |
| | | | | 359/676 |
| 2006/0098298 | A1 * | 5/2006 | Kato | G02B 17/08 |
| | | | | 359/649 |
| 2015/0079521 | A1 * | 3/2015 | Benson, Jr. | G03F 7/203 |
| | | | | 430/296 |
| 2015/0293331 | A1 * | 10/2015 | Yonezawa | G02B 13/0045 |
| | | | | 359/714 |
| 2016/0260752 | A1 | 9/2016 | Shieh et al. | |
| 2017/0184815 | A1 * | 6/2017 | Wang | G02B 5/005 |
| 2018/0029929 | A1 * | 2/2018 | Paulson | H05K 5/03 |
| 2019/0386251 | A1 * | 12/2019 | Erickson | H01L 51/5275 |

FOREIGN PATENT DOCUMENTS

| | | | | |
|---|---|---|---|---|
| WO | WO 2018/017552 | | 1/2018 | |
| WO | WO 2018/080830 | | 5/2018 | |
| WO | WO-2018080830 A1 * | | 5/2018 | ......... B81C 1/00031 |

OTHER PUBLICATIONS

United States Office Action, U.S. Appl. No. 16/687,509, filed Aug. 27, 2020, ten pages.

* cited by examiner

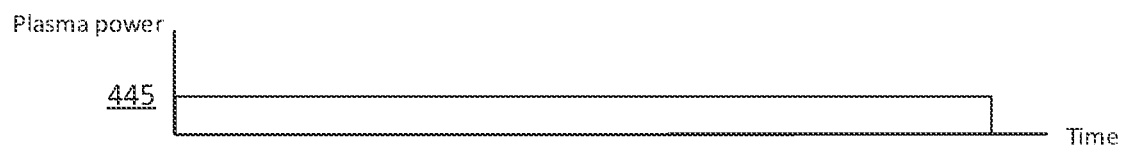
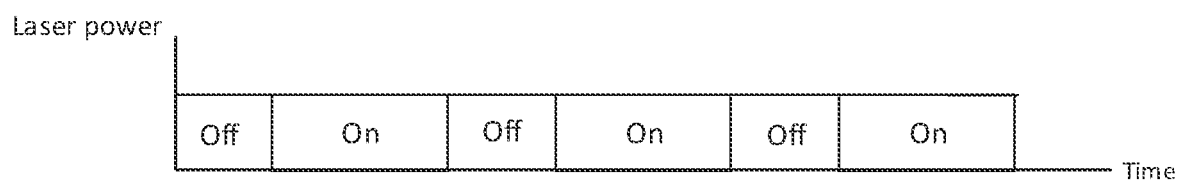
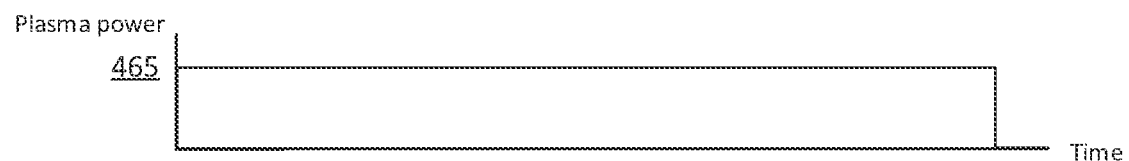
FIG. 4B

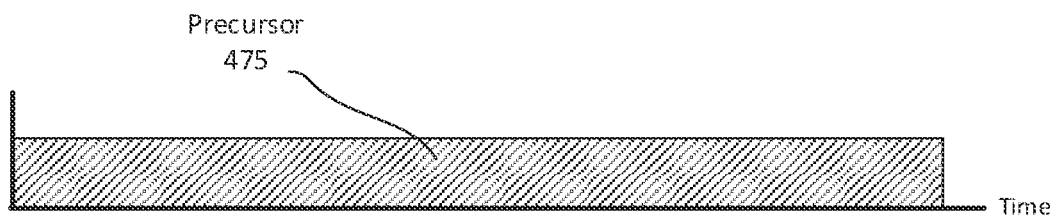
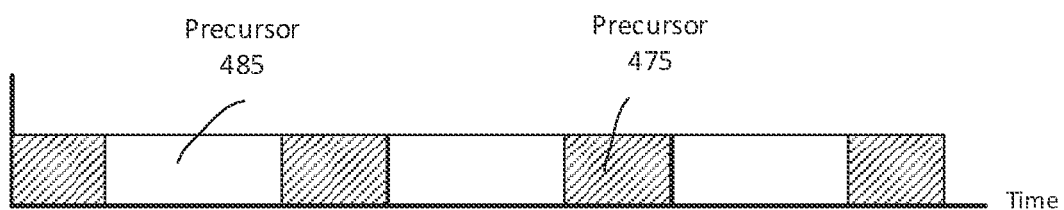
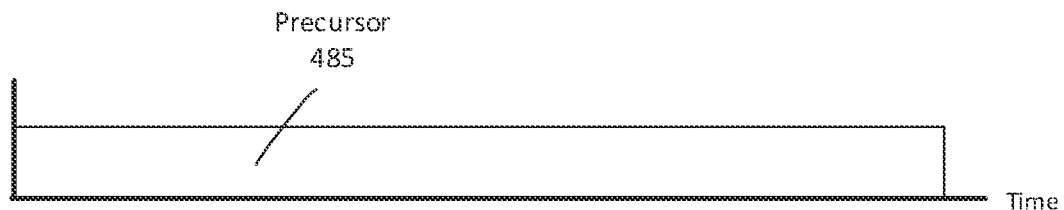
FIG. 4C

FLEXIBLE POLYMERIC FILM INCLUDING REINFORCEMENT LAYER

CROSS-REFERENCE TO RELATED APPLICATIONS

This application is a division of U.S. application Ser. No. 16/687,509, filed on Nov. 18, 2019, which claims the benefit of U.S. Provisional Patent Application No. 62/771,064, filed on Nov. 24, 2018; and U.S. Provisional Patent Application No. 62/798,974, filed on Jan. 30, 2019, which are incorporated by reference herein in their entirety.

BACKGROUND

Field of the Disclosure

The present disclosure generally relates to polymeric films, and specifically to a flexible polymeric film that includes a reinforcement layer and a method of producing such a flexible polymeric film.

Description of the Related Arts

Thin polymeric films are playing an important role in technological applications such as electronic packaging, optical coatings, lithographic resist layers, barrier layers, and so on. Mechanical properties of thin polymeric films are of paramount importance since these properties often impact many of the reliability issues encountered while integrating the films into devices, such as electrical display devices. Conventional thin polymeric films have high flexibility but low rigidity, which impairs their reliability for applications in these devices. For example, scratches or dents can be generated in conventional thin polymeric films when they are used as protection cover films of the flexible displays.

SUMMARY

Embodiments relate to a flexible polymeric film that includes a reinforcement layer and a base layer. The reinforcement layer reinforces mechanical properties of the flexible polymeric film. The reinforcement layer includes a lamella and a plurality of columns. The columns are on a surface of the lamella. Each of the columns extends in a direction and is separated from a neighboring column by a gap. The base layer is coupled to the columns and portions of the surface of the lamella in the gaps between the columns. The base layer is less rigid than the reinforcement layer.

In some embodiments, the flexible polymeric film is produced by spraying a precursor onto a substrate. The precursor can include an organic material and a metal-organic material. A layer of the precursor is formed on the substrate. The layer of the precursor can be exposed to an energy beam, e.g., plasma radicals, e-beam, laser beam, and/or ultraviolet (UV), to form a preliminary film on the substrate to form a preliminary film on the substrate. The columns can be formed from a plurality of portions of the preliminary film. The columns are more rigid than other portions of the preliminary film. The lamella is formed on top of the preliminary film that is formed with the columns.

BRIEF DESCRIPTION OF THE DRAWINGS

The teachings of the embodiments can be readily understood by considering the following detailed description in conjunction with the accompanying drawings.

Figure (FIG. 1A is a perspective view of a flexible polymeric film, in accordance with an embodiment.

FIG. 4B is a timing diagram illustrating a process of forming columns and a lamella of a flexible polymeric film by applying plasma and laser beams, in accordance with an embodiment.

FIG. 4C is a timing diagram illustrating a process of forming columns and a lamella of a flexible polymeric film by switching precursors, in accordance with an embodiment.

The figures depict various embodiments for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number correspond to the figure in which the reference number is first used.

Embodiments relate to a flexible polymeric film that has a reinforcement layer for enhancing rigidity of the flexible polymeric film. The reinforcement layer includes a lamella and discrete columns arranged on a surface of the lamella. Each of the columns extends in a direction and is separated from a neighboring column by a gap. The flexible polymeric film also includes a base layer that provides flexibility. The base layer is less rigid than the reinforcement layer. The base layer can have an elasticity that is sufficient for providing a restorative force when the flexible polymeric film is bent or deformed. The flexible polymeric film can be produced by spraying a precursor or successive spraying of precursors onto a substrate to form a layer of the precursor on the substrate. The layer of the precursor is exposed to an energy beam to form a preliminary film on the substrate. The columns can be formed from a plurality of portions of the preliminary film, resulting in an intermediate film. The intermediate film is the preliminary film that is formed with the columns. The columns are more rigid than other portions of the preliminary film. The lamella is formed on top of the intermediate film to form the flexible polymeric film. The flexible polymeric film can have a smooth and flat surface, and be transparent for optical applications, such as screen protection cover film, touch panel, encapsulation, passivation, etc.

Figure 1A:
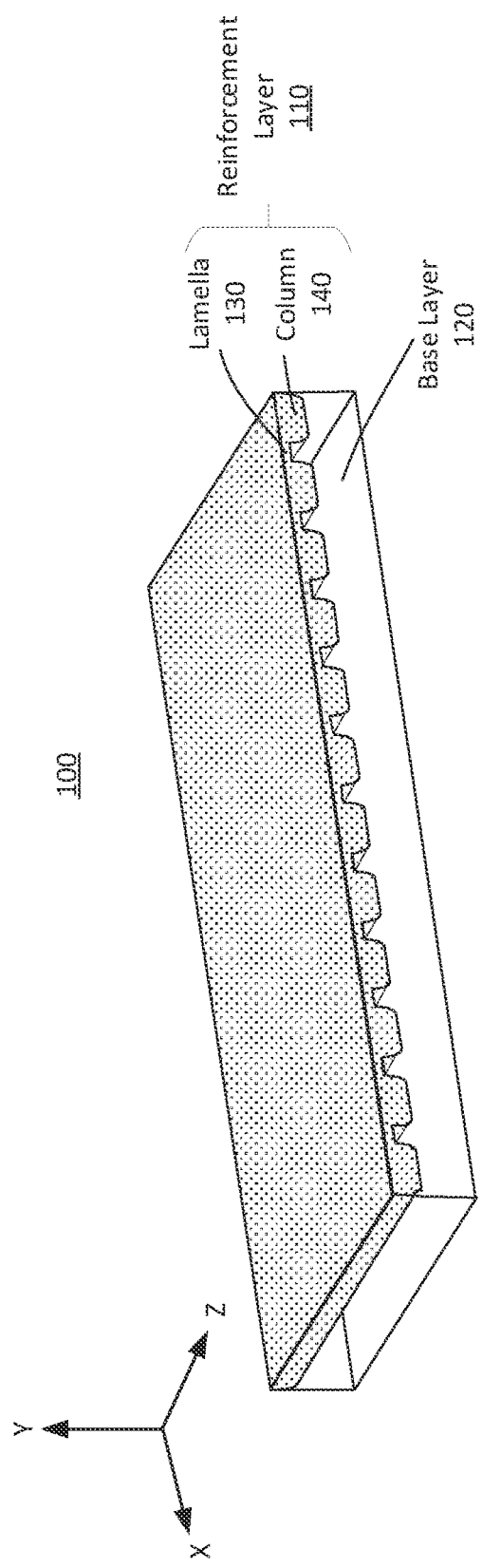
FIG. 1B is a cross-sectional view of the flexible polymeric film in FIG. 1A, in accordance with an embodiment.
Figure 1B:
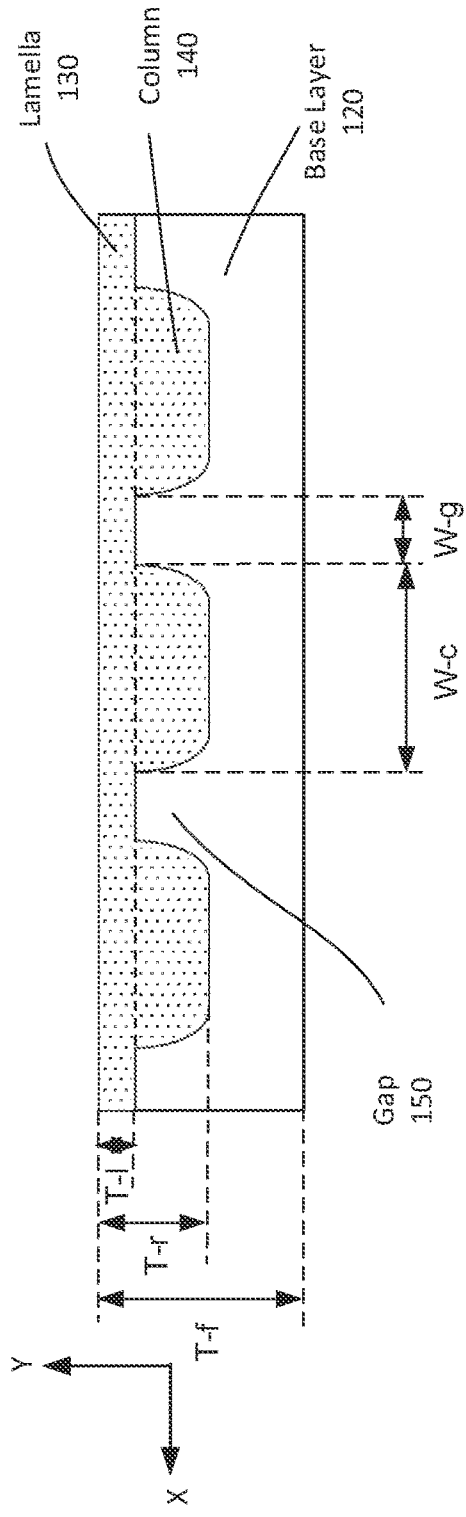

FIG. 1A is a perspective view of a flexible polymeric film 100, in accordance with an embodiment. FIG. 1B is a cross-sectional view of the flexible polymeric film 100 in FIG. 1A, in accordance with an embodiment. A thickness T-f of the flexible polymeric film 100 is, for example, in a range from 50 µm to 500 µm. The flexible polymeric film 100 can be used on handheld or mobile devices, e.g., as a scratch-proof protection cover. The flexible polymeric film 100 can also be used on non-mobile device applications, such as monitors or TV. When used on non-mobile device applications, the flexible polymeric film 100 can have a larger thickness T-f or other dimensions. A thickness T-f of the flexible polymeric film 100 is, for example, in a range from 100 µm to 1 mm for devices with 10 inch by 10 inch or larger screen size. Other dimensions may follow the ratios described herein. The flexible polymeric film 100 may include a reinforcement layer 110 and a base layer 120.

The reinforcement layer 110 reinforces rigidity of the flexible polymeric film 100, e.g., it increases rigidity of the side of the film where the reinforcement layer 110 is located. The reinforcement layer 110 includes a lamella 130 and an array of columns 140 (referred individually as "column 140"). The lamella 130 and columns 140 are more rigid than the base layer 120. The lamella 130 and columns 140 can have higher Young's modulus than the base layer 120. The columns 140 are on a surface of the lamella. Each column 140 extends along the Z axis and is separated from its neighboring column(s) 140 by a gap 150. In some embodiments, the flexible polymeric film 100 is rigid in a direction along the Z axis and flexible in a different direction, such as a direction along the Y axis that is perpendicular to the Z axis. The flexible polymeric film 100 can be bent or rolled in a direction along the Y axis. A restorative force can be generated in the flexible polymeric film 100 to restore the flexible polymeric film 100 to its original form, i.e. flat and/or non-deformed state, when the flexible polymeric film 100 is bent or rolled. For purpose of simplicity illustration, FIG. 1B shows three columns 140 and four gaps 150. FIG. 1A shows more columns 140 and gaps 150. But the reinforcement layer 110 can have a different number of columns 140.

In some embodiments, a width W-c of each column 140 can be larger than a width W-g of the corresponding gap(s) 150. The width W-c of each column 140 can be less than 500 micrometers (µm), e.g., in a range from 10 µm to 500 µm. The width W-g of each gap 150 can be less than 250 µm, e.g., in a range from 1 µm to 250 µm. In some embodiments, the flexible polymeric film 100 is used on a display device, such as a touch screen. A user can use a tool, such as a pen, to interact with content displayed on the device. The width W-g of some or all the gaps 150 is smaller than a portion of the tool that contact the flexible polymeric film 100 during the usage of the tool. The portion of the tool may be a tip or sharp edge that can potentially make scratches or dents on the flexible polymeric film 100. As W-g is smaller than the portion of the tool, the portion of the tool can contact a portion of the flexible polymeric film 100 that includes at least a portion of a column 140. As the column 140 is rigid, it can prevent the portion of the tool from making the scratches and dents.

In some embodiments, a ratio of a thickness T-c of the columns 140 to a thickness T-l of the lamella 130 is equal to or larger than 10. The thickness T-l of the lamella 130 can be in a range from 100 nanometers (nm) to 20 µm. A thickness T-r of the reinforcement layer 110 can be in a range from 1 µm to 500 µm.

The base layer 120 is less rigid than the reinforcement layer 110. In some embodiments, the base layer 120 has a high elasticity, i.e. smaller elastic modulus, than the reinforcement layer 110. A surface of the base layer 120 faces the reinforcement layer 110, contacts the columns 140 and gaps 150, and is not flat. Another surface of the base layer 120 that faces away from the reinforcement layer 110 is flat. The base layer includes a polymer material, such as polyurethane, polyimide, a polymer material represented as R (or Polymer)-N=C—O-[cross-linking with Metal, C, N, O, H and its double bonds, and triple bonds], or a polymer material represented as R (or Polymer)-N=C—O-[cross-linking with Metal, C, N, S, O, H and its double bonds, and triple bonds].

In some embodiments, the reinforcement layer 110 is formed from cross-linking molecules of the polymeric material of the base layer 120. Strong bonds between the reinforcement layer 110 and the base layer 120 can be generated due to the increased cross-linking and transformation of the polymeric material in the base layer 120 to a more rigid phase in the reinforcement layer 110. In some embodiments, the interface between the reinforcement layer 110 and the base layer 120 (including the interface between the lamella 130 and the base layer 120 and the interface between the columns 140 and the base layer 120) are formed with ionic bonds and/or covalent bonds by taking interstitial or substitutional atoms from neighboring molecules. Examples of the bonds include —(C=C)—, —(C≡C)—, —(C=N)—, —(C≡N), —(C—S)—, —(C=S), —(S—S)—, —(S=N)—, (S=S), (S=O), -(M-O)—, -(M=O), -(M=N)—, and -(M≡C)—, where M is a metal atom (e.g., Al, Zr, Sn, Ti, Ni, Ag, Cu, Mn, Co, Zn, In, Ga, etc.).

Figure 2A:
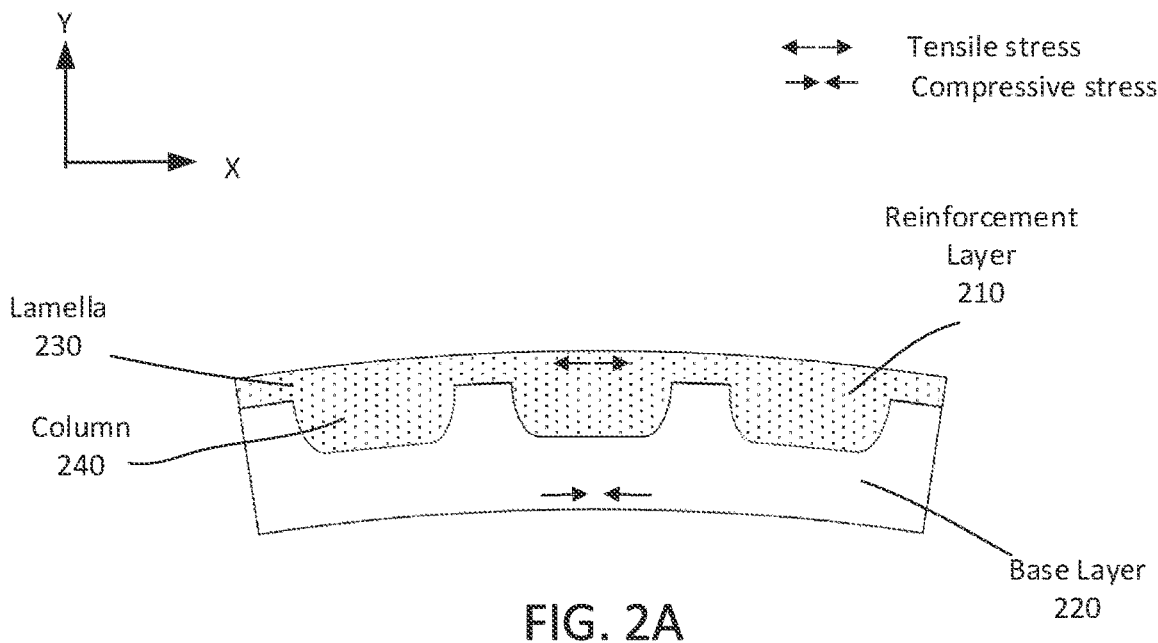
FIG. 2A illustrates a flexible polymeric film being bent downward, in accordance with an embodiment.

FIG. 2A illustrates a flexible polymeric film 200 being bent downward, in accordance with an embodiment. The flexible polymeric film 200 includes a reinforcement layer 210 and a base layer 220. The reinforcement layer 210 is on top of the base layer 220 and is more rigid than the base layer 220. The reinforcement layer 210 includes a lamella 230 and columns 240 on a surface of the lamella 230. An embodiment of the flexible polymeric film 200 is the flexible polymeric film 100 described above in conjunction with FIGS. 1A and 1B.

As the flexible polymeric film 200 is bent downward, the reinforcement layer 210 is under tensile stress and the base layer 220 is under compressive stress. There are no cracks generated in the lamella 230 by the bending, as the lamella 230 has high tensile strength, e.g., due to cross-linking of polymer molecules or elasticity of polymeric material. In some embodiments, the tensile strength of the lamella 230 decreases with its thickness. A thickness of the lamella 230 can be no more than 20 µm, e.g., to allow the flexible polymeric film 200 to be bent. A flexible polymeric film may have a radius smaller than 2 mm.

Figure 2B:
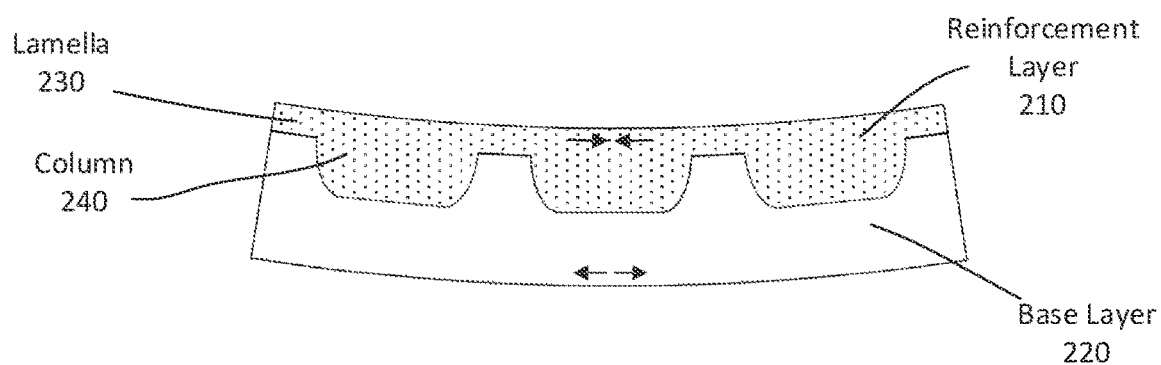
FIG. 2B illustrates the flexible polymeric film being bent upward in accordance with an embodiment.

FIG. 2B illustrates the flexible polymeric film 200 being bent upward in accordance with an embodiment. As the flexible polymeric film 200 is bent upward, the reinforcement layer 210 is under compressive stress and the base layer 220 is under tensile stress. As the base layer 220 has a high elasticity, the polymer chains in the base layer 210 can be stretched elastically under the tensile stress and return their original form after the tensile stress is removed. There are no cracks generated in the base layer 220 during the bending. Due to the reinforcement layer 210 plus the base layer 220 structure, the flexible polymeric film 200 is free from cracks when it is bent along the Y direction, either upward or downward.

Figure 3:
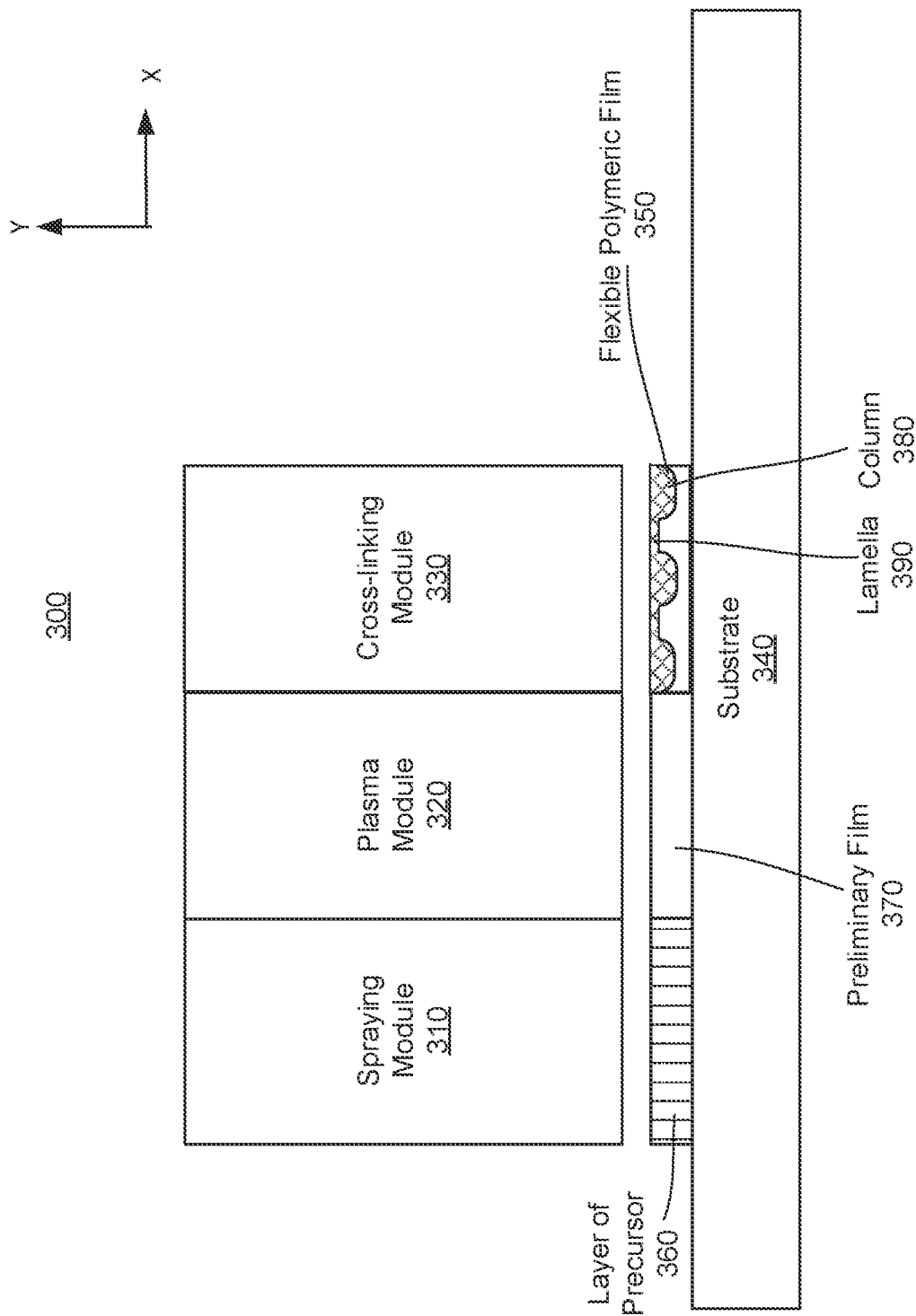
FIG. 3 illustrates a schematic view of a film forming apparatus, in accordance with an embodiment.

FIG. 3 illustrates a schematic view of a film forming apparatus 300, in accordance with an embodiment. The film forming apparatus 300 produces a flexible polymeric film 350 on a substrate 340. An embodiment of the flexible polymeric film 350 is the flexible polymeric film 100 described above. The substrate 340 can be plastic, membrane (organic and/or inorganic), fabric, non-gas permeable charge-transfer film or conductor film (e.g., Nefion), inorganic-organic hybrid film (e.g., metalcone film), man-made hermetic film (e.g., encapsulating laminates or composites), thin metal or conducting transparent film, bio-substrate, or sacrificial film to be peeled off.

The film forming apparatus 300 includes a spraying module 310, a plasma module 320, and a cross-linking module 330. In the embodiment of FIG. 3, the film forming apparatus 300 remains stationary, and the substrate 340 moves in a direction along the X axis from the spraying module 310 towards the cross-linking module 330. In some other embodiments, the substrate 340 remains stationary and the film forming apparatus 300 moves in a direction along the X axis.

The spraying module 310 sprays a precursor towards the substrate 340. A layer of precursor 360 is formed on the substrate. In some embodiments, the precursor is a mixture of an organic precursor and a metal organic precursor. Examples of the precursor includes metal containing precursor, polyol, diisocyanate, coupling agents, silane coupling agent that contains an organic function group (e.g., vinyl, chloro, epoxy, methacryloxy, mercapto, etc.) with a second functional group (e.g., methoxy, ethoxy, etc.), polyurethane polyols, dianhydrides, diisocyanate, and silane coupling agent.

After the layer of precursor 360 is formed on a portion of the substrate 340, the portion of the substrate 340 moves along the X axis toward the plasma module 320. The plasma module 320 forms a preliminary film 370 from the layer of precursor 360, e.g., by solidifying the layer of precursor 360. In some embodiments, the plasma module 320 generates plasma radicals and exposes the layer of the precursor 360 to the plasma radicals to form the preliminary film 370. In some embodiments, the preliminary film 370 has a thickness in a range from 50 µm to 500 µm. The plasma can be $O_2$, $N_2O$, $H_2O$, Ar, Na, or $NH_3$ plasma.

In some embodiment, the preliminary film 370 is formed by spraying an additional precursor onto the layer of precursor 360 to form a layer of the additional precursor on top of the layer of the precursor 360. The additional precursor can be sprayed by a second spraying module that is located between the spraying module 310 and the plasma module 320. The preliminary film 370 can be formed by exposing the layer of the additional precursor to an energy beam, e.g., plasma radicals generated by the plasma module 320.

In some embodiments, an initial film is formed by exposing the layer of the precursor 360 to an energy beam, e.g., the plasma radicals generated by the plasma module 320. An additional precursor is sprayed, e.g., by a second spraying module located between the plasma module 320 and the cross-linking module 330, to form a layer of the additional precursor. The layer of the additional precursor can be exposed to an energy beam, e.g., plasma radicals generated by a second plasma module located between the second spraying module and the cross-linking module 330, to form the preliminary film 370.

In one embodiment, the precursor sprayed by the spraying module 310 is an organic precursor and the precursor sprayed by the second spraying module is a metal organic precursor. In another embodiment, the precursor sprayed by the spraying module 310 is a metal organic precursor and the precursor sprayed by the second spraying module is another metal organic precursor. In yet another embodiment, the precursor sprayed by the spraying module 310 is an organic precursor and the precursor sprayed by the second spraying module is another organic precursor.

The cross-linking module 330 forms columns 380 (referred individually as "column 380") and a lamella 390 from portions of the preliminary film 370, thereby forming the flexible polymeric film 350 is thereby formed. The columns 380 and lamella 390 are more rigid than the rest of the flexible and elastic polymeric film 350.

In some embodiments, the cross-linking module 330 forms the columns 380 through cross-linking of molecules of one or more materials of the preliminary film 370. Thus, the columns 380 has a higher degree of cross-linking than other portions of the preliminary film 370. For example, the cross-linking module 330 exposes the portions of the preliminary film to an energy beam, such as plasma radicals, and the plasma radicals cause the cross-linking. The plasma radicals can penetrate the top surface of the preliminary film 370. The plasma radicals can break the C—H bonds in the material of the preliminary film 370 and form different bonds, such as C=C, C≡C, N—H, N=N, N≡N, C=N, C≡N, S—S, S=S, or S=O bonds. The plasma radicals include oxygen-based plasma radicals. The cross-linking module 330 can use a higher plasma power to form the columns 380 than the plasma power used by the plasma module 320 for forming the preliminary film 370.

In some embodiments, the cross-linking module 330 forms the columns 380 by exposing the portions of the preliminary film to laser beams, electron beams, or ultraviolet (UV) irradiation. The laser beams, electron beams, or UV irradiation can generate more bonds, such as -(M-O)—, -(M=O), -(M=N)—, -(M≡C)—, -(M=C)—, or -(M≡C)—. These bonds result in increase in tensile strength, impact strength, and material strength. The cross-linking module 330 can control the width and thickness of the columns 380 and the width of gas between the columns 380 by controlling intensity and/or exposing time of the laser beams, electron beams, or UV irradiation, or moving speed of the substrate 340. It can also control extending direction of cross-linking in the columns 380 by controlling injection direction of the laser beams, electron beams, or UV irradiation. The cross-linking module 330 can also control the direction of the columns 380 by controlling configuration of electrodes that generate plasma radicals, injection direction of laser beams or electron beams, etc. As shown in FIG. 3, the columns 380 extend in a direction that is perpendicular to the direction where the substrate 340 moves, i.e., a direction along the X axis in FIG. 3. In other embodiments, the cross-linking module 330 can form columns that extend in a direction parallel to the direction where the substrate 340 moves.

In some embodiments, the cross-linking module 330 forms the lamella 390 by exposing the preliminary film formed with the columns 380 to plasma radicals, laser beams, or electron beams to cause cross-linking of molecules. The lamella 390 thereby has a higher degree of crosslinking than the preliminary film and is more rigid.

In some other embodiments, the cross-linking module 330 sprays a second precursor (e.g., metal-organic precursor) onto the preliminary film formed with the plurality of columns 380. The second precursor can be the same as or different from the precursor sprayed by the spraying module 310. Examples of the second precursor includes DiMethylAluminum Isopropoxide (DMAI), DMAON ($C_{11}H_{26}AlON$), 3-((Dimethylanimo)Propyl)Aluminumum) (DMPA), and Trimethyl aluminum (TMA) as a precursor of Al-incorporated film; Dimethyldichlorosilane (DMDCS), (dimethylamino)tri-methylsilane (DMATMS), hexamethyldisilazane (HMDS), and bis (dimethylamino)dimethylsilane (BDMADMS) for Si-incorporated film; Tetrakisdimethylaminotitanium (TDMAT) and tetrakis ethylmethylaminotitanium (TEMAT) for Ti-incorporated film. The second precursor may be a metal organic precursor that includes metal atoms such as Zr, Zn, Ni, Ag, Ta, W, etc.

The cross-linking module 330 further generates plasma and exposes the layer of the second precursor to the plasma to transfer it to the lamella 390. The plasma can be oxygen based plasma. In some embodiments, the second precursor is a metal-organic precursor, and the plasma causes oxidation, nitridation, or carbonization of the metal-organic precursor.

The cross-linking module 330 can enhance rigidity of the lamella 390 through an infiltration or impregnation process. For instance, the cross-linking module 330 form a composite layer through infiltration or impregnation of a metal-contained precursor into the lamella 390. The metal-contained precursor can be a metal-organic precursor of Alucone, Titanicon, Zircone, Silicone, Zincone, etc.

The cross-linking module 330 may form multiple lamellae. Each of the lamellae can have an orientation that is perpendicular to the orientation of its neighboring lamella(s). The orientation of a lamella is an orientation of cross-linking in the lamella. The lamellae having those different orientations can be formed by rotating the substrate 340 by 90 degrees after forming each lamella. For example, two lamellae either in plane with 90 degree rotated each other or perpendicular. The cross-linking module 330 may form an odd number of lamellae to avoid warping, as the flexible polymeric film 350 can have high stiffness in a direction perpendicular to the orientation of the top lamella. The structure of having multiple lamellae with different orientations can prevent moisture and/or gas penetration into the flexible polymeric film 350, result in better dimensional stability, minimize the chance of overlap or connections of pinholes within the lamellae, and achieve consistent mechanical strength across all directions. Neighboring lamellae can be separated by a layer of polymeric material, such as the polymeric material of the preliminary film 370.

Figure 4A:
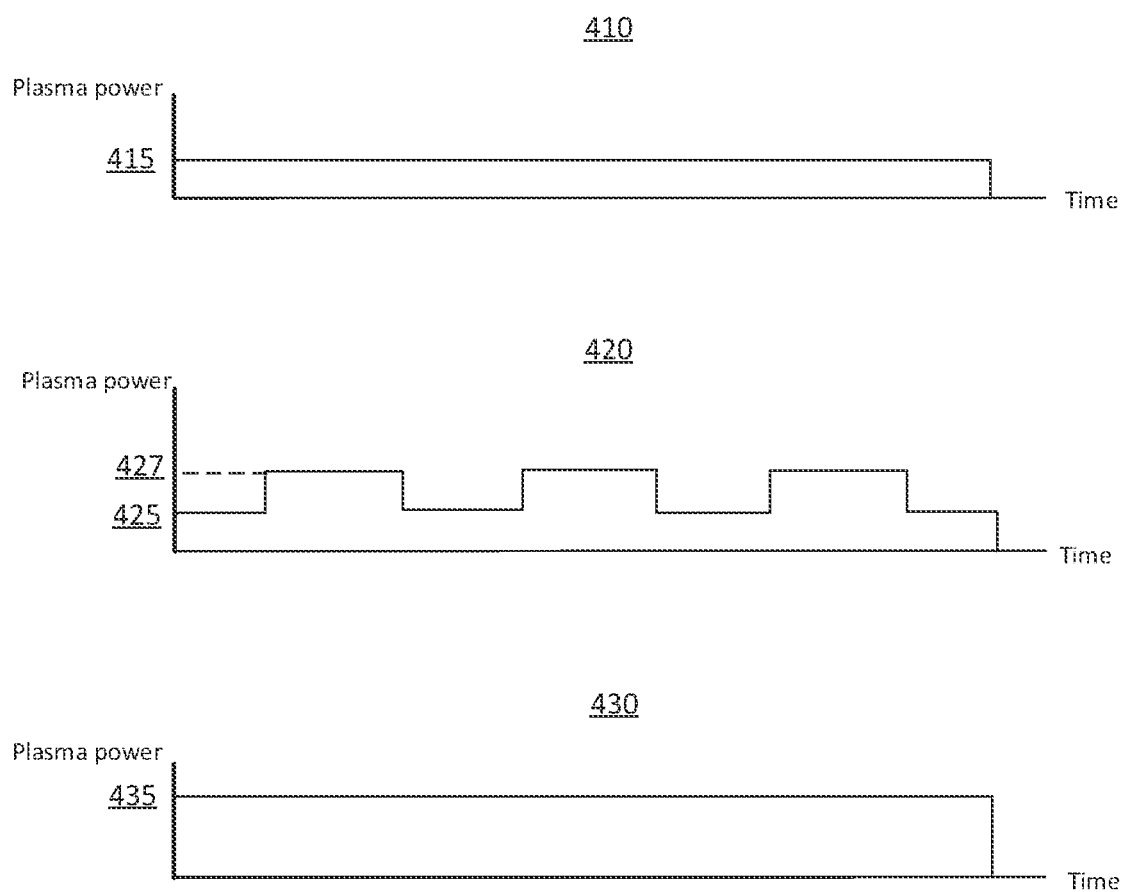
FIG. 4A is a timing diagram illustrating a process of forming columns and a lamella of a flexible polymeric film by modulating plasma power, in accordance with an embodiment.

FIG. 4A is a timing diagram illustrating a process of forming columns and a lamella of a flexible polymeric film by modulating plasma power, in accordance with an embodiment. The process can be performed by the film forming apparatus 300 in FIG. 3 to form the columns 380 and lamella 390. FIG. 4A shows plasma power as a function of time for three processes 410, 420, and 430.

In the process 410, the film forming apparatus 300 continuously exposes the layer of precursor 360 to plasma radicals having a plasma power 415 to form the preliminary film 370.

In the process 420, the film forming apparatus 300 alternatively exposes the preliminary film 370 to plasma radicals having a plasma power 425 and plasma radicals having a plasma power 427 to form the columns 380 from portions of the preliminary film 370. The plasma power 427 is higher than the plasma power 425. The plasma power 427 is high enough to cause cross-linking of molecules of the polymeric material in the preliminary film 370. The plasma power 425 can be equal to the plasma power 415 in the process 410. The film forming apparatus 300 can apply the plasma power 427 to a portion of the preliminary film 370 where a column 380 is intended to be formed, and apply the plasma power 425 to a portion of the preliminary film 370 where no column 380 is intended to be formed. The columns 380 have a higher degree of cross-linking and are more rigid than the rest of the preliminary film 370.

In the process 430, the film forming apparatus 300 exposes the preliminary film 370 formed with the columns 380 to plasma radicals having a plasma power 435 to form the lamella 390. The plasma power 435 is also high enough to cause cross-linking of molecules of the polymeric material in the preliminary film 370 so that the lamella 390 also has a higher degree of cross-linking and are more rigid than the rest of the preliminary film 370. The plasma power 435 can be equal to the plasma power 427 in the process 420.

FIG. 4B is a timing diagram illustrating a process of forming columns and a lamella of a flexible polymeric film by applying plasma and laser beams, in accordance with an embodiment. The process can be performed by a film forming apparatus, such as the film forming apparatus 300 in FIG. 3 to form the columns 380 and lamella 390. FIG. 4B shows plasma power as a function of time for three processes 440, 450, and 460. The processes 440 and 460 can be the same as the processes 410 and 430 in FIG. 4A, respectively. For instance, the plasma power 445 is the same as the plasma power 415, and the plasma power 465 is the same as the plasma power 435. But the process 450 is different from the process 420.

In the process 450, the film forming apparatus 300, particularly the cross-linking module 330, injects laser beams towards portions of the preliminary film 370 to form the columns 380. The laser power alternates between on and off. The laser power is on when a portion of the preliminary film 370 from which a column is intended to be formed is under the cross-linking module 330. Likewise, the laser power is off when a portion of the preliminary film 370 from which no column is intended to be formed is under the cross-linking module 330.

FIG. 4C is a timing diagram illustrating the process of forming columns and a lamella of a flexible polymeric film by switching precursors, in accordance with an embodiment. The process can be performed by a film forming apparatus, such as the film forming apparatus 300 in FIG. 3 to form the columns 380 and lamella 390. FIG. 4C shows plasma power as a function of time for three processes 470, 480, and 490. During the processes 470, 480, and 490, the substrate 340 is exposed to a plasma, such as oxygen based plasma.

In the process 470, the film forming apparatus 300 continuously sprays a precursor 475 towards the substrate 340 to form a layer of precursor 360. The plasma transfers the layer of precursor 360 to the preliminary film 370. In one embodiment, the precursor 475 is a precursor for Polyol/Isocyanate.

In the process 480, the film forming apparatus 300 alternatively sprays the precursor 475 and a different precursor 485 to the preliminary film 370. The plasma transfers the precursor 485 to the columns 380 and transfers the precursor 475 to a polymeric material of the preliminary film 370 between the columns 380, i.e., gaps between the columns 380. In some embodiments, the precursor 485 is a precursor for alumina.

In the process 490, the film forming apparatus 300 continuously sprays the precursor 485 to the preliminary film 370 formed with the columns 380. The plasma transfers the precursor 485 to the lamella 390, e.g., by solidifying a layer of the precursor 485.

Figure 5A:
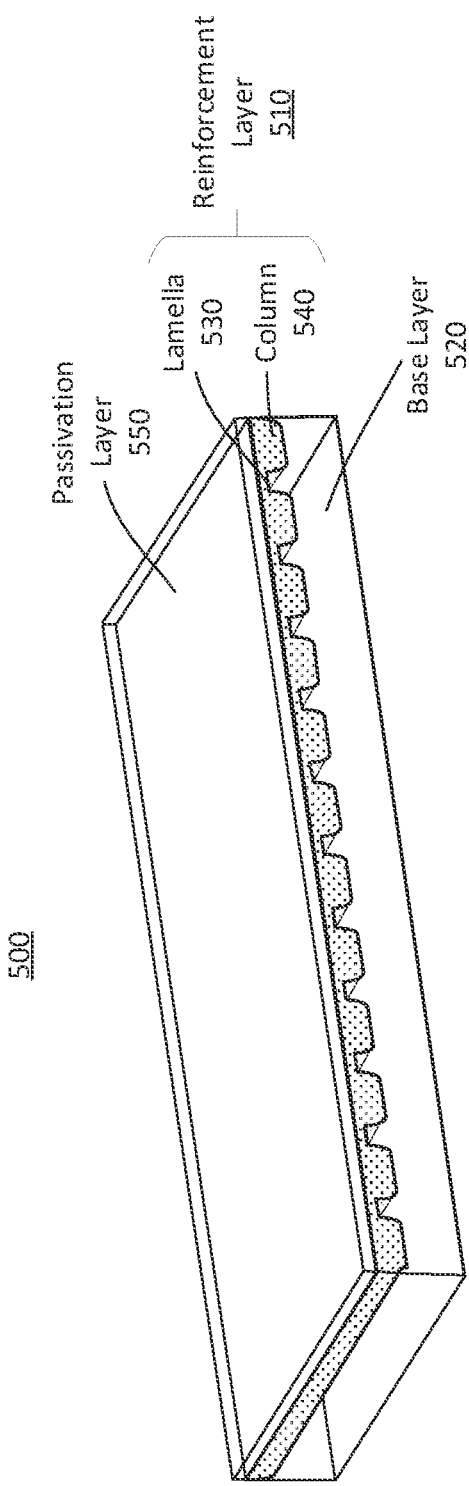
FIG. 5A is a perspective view of a flexible polymeric film including a passivation layer, in accordance with an embodiment.
Figure 5B:
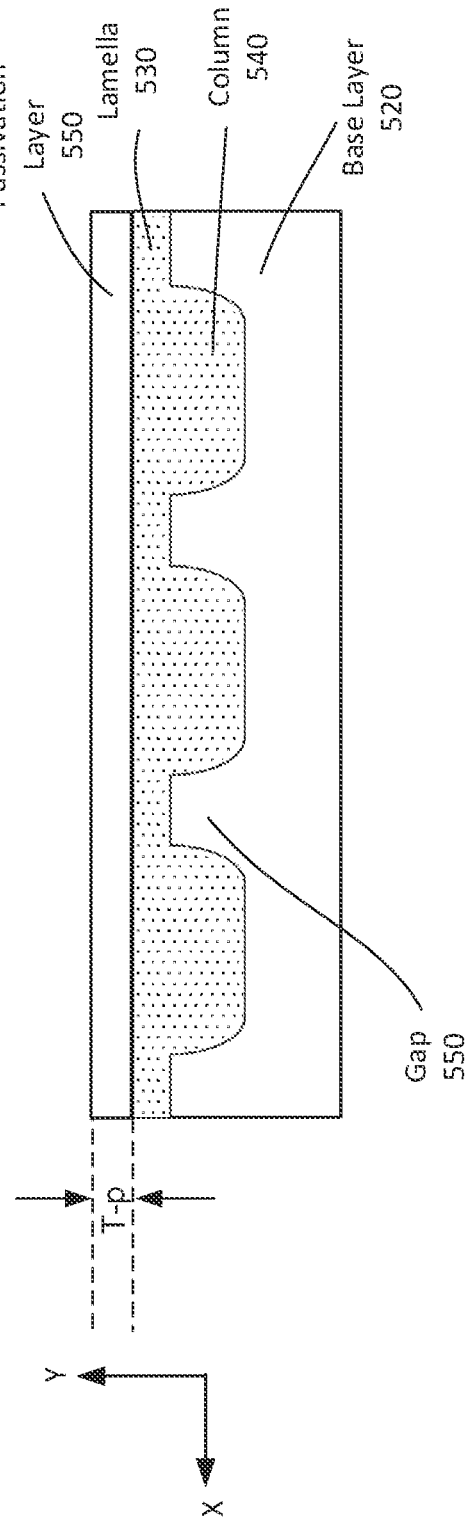
FIG. 5B is a cross-sectional view of the flexible polymeric film in FIG. 5A, in accordance with an embodiment.

FIG. 5A is a perspective view of a flexible polymeric film 500 including a passivation layer 550, in accordance with an embodiment. FIG. 5B is a cross-sectional view of the flexible polymeric film 500 in FIG. 5A, in accordance with an embodiment. The flexible polymeric film 500 also includes reinforcement layer 510 and a base layer 520. The reinforcement layer 510 includes a lamella 530 and columns 540 on a surface of the lamella 530. An embodiment of the reinforcement layer 510 is the reinforcement layer 110, and an embodiment of the base layer 520 is the base layer 120 discussed above.

The passivation layer 550 has a higher elasticity, i.e. smaller elastic modulus, than the reinforcement layer 510. The passivation layer 550 can accommodate stress applied on the flexible polymeric film 500, such as stress caused by bending, rolling, or folding the flexible polymeric film 500. The passivation layer 550 is on another surface of the lamella 530 that faces away from the columns 540, i.e., the surface of the lamella 530 opposing the surface where the columns 540 are. In some embodiments, the passivation layer 550 has a thickness T-p along the Y axis in a range from 100 nm to 10 µm. The passivation layer 550 can be transparent to light, and can be an oleophobic coating, transparent conducting layer (e.g., ITO (Indium Tin Oxide) or $SnO_2$), self-healing sulfur vulcanized polymer layer, or cross-linked Metalcones. The passivation layer 550 can be durable and scratch-resistant. For example, the passivation layer 550 can be a hard coating (e.g., $Al_2O_3$, Al—Si—O, Al—Ti—O, Al—Zr—O, $ZrO_2$, $TiO_2$, Diamond Like Coating).

Figure 6A:
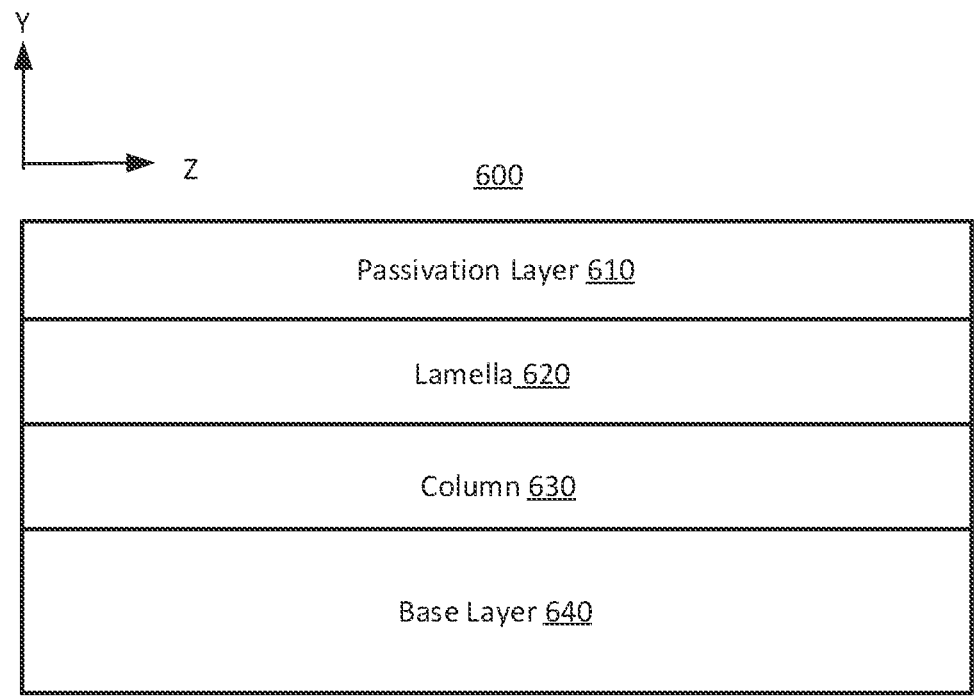
FIG. 6A is a cross-sectional view of a flexible polymeric film including a stack of various layers, in accordance with an embodiment.

FIG. 6A is a cross-sectional view of a flexible polymeric film 600 including a stack of various layers in the Y-Z plane, in accordance with an embodiment. The flexible polymeric film 600 includes a passivation layer 610, a lamella 620, a column 630, and a base layer 640. The flexible polymeric film 600 can be an embodiment of the flexible polymeric film 500. In some embodiments, the flexible polymeric film 600 does not include the passivation layer 610 or lamella 620. The passivation layer 610, lamella 620, column 630, and base layer 640 have a same length along the X axis. The column 630 extends along the whole bases layer 640. The flexible polymeric film 600 includes other columns extending along the Z axis that are parallel to the column 630, and these columns are separate from each other with a gap.

Figure 6B:
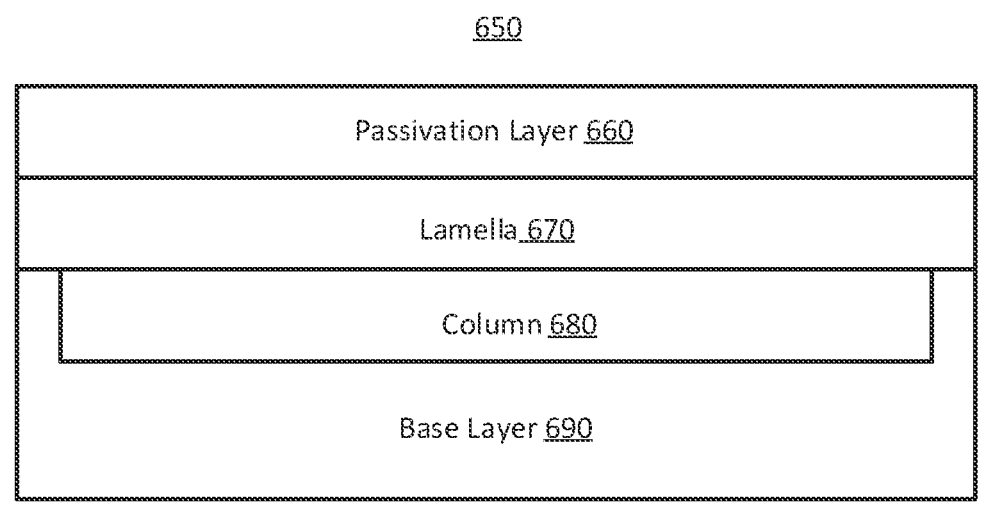
FIG. 6B is a cross-sectional view of another flexible polymeric film including a stack various layers, in accordance with an embodiment.

FIG. 6B is a cross-sectional view of another flexible polymeric film 650 including a stack various layers in the X-Y plane, in accordance with an embodiment. The flexible polymeric film 650 includes a passivation layer 660, a lamella 670, a column 680, and a base layer 690. The flexible polymeric film 600 can be an embodiment of the flexible polymeric film 500. In some embodiments, the flexible polymeric film 650 does not include the passivation layer 660 or lamella 670. The passivation layer 660, lamella 670, and base layer 680 have a same length along the X axis, but the column 680 has a shorter length. The column 680 extends along a portion of the base layer 680. The flexible polymeric film 650 includes other columns extending along the Z axis that are parallel to the column 680, and these columns are separate from each other with a gap.

Figure 7:
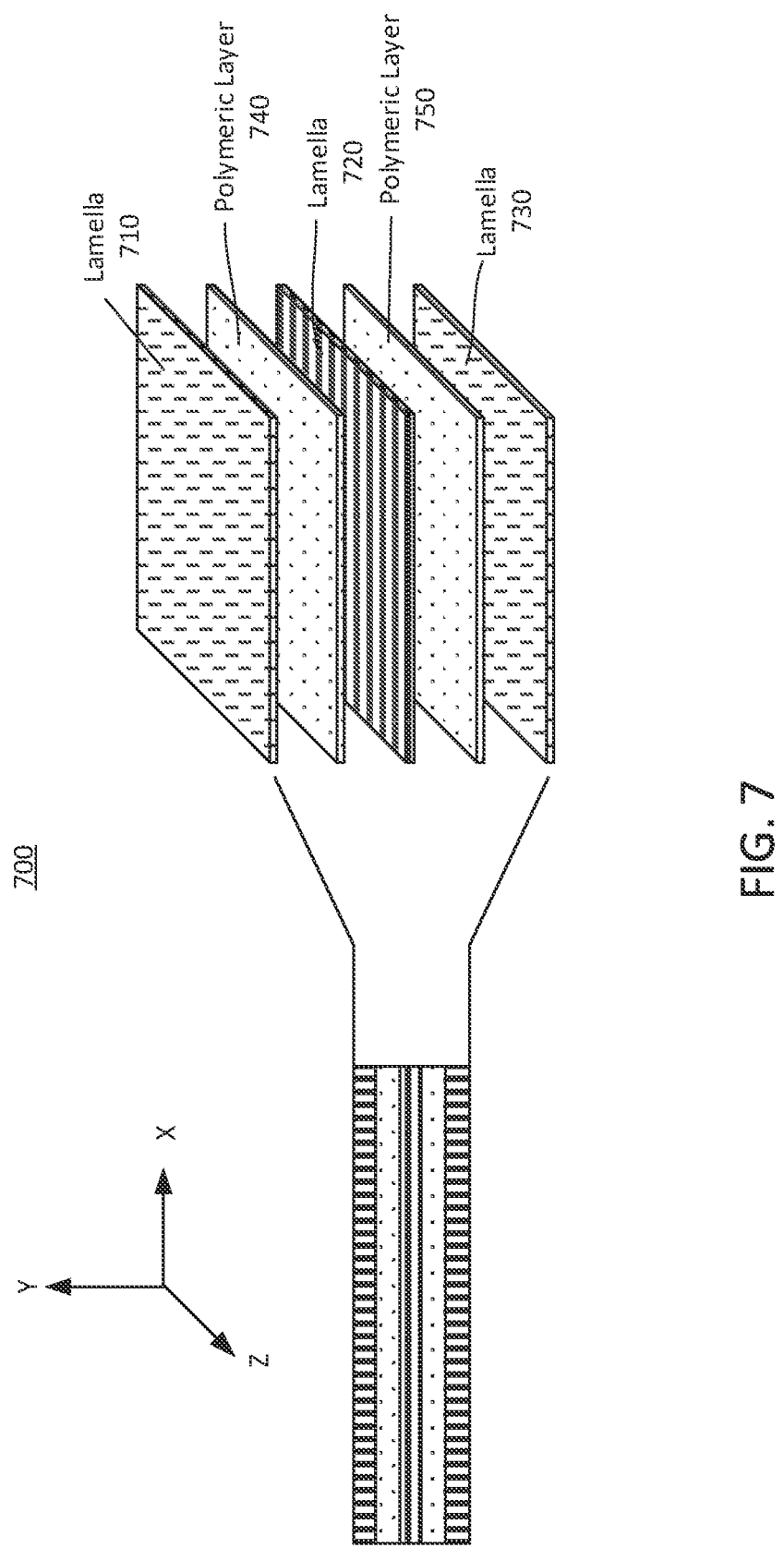
FIG. 7 illustrates a lamella stack in accordance with an embodiment.

FIG. 7 illustrates a lamella stack 700, in accordance with an embodiment. The lamella stack 700 can be a part of a flexible polymeric film. The flexible polymeric film can also include columns, such as the columns 140, that extend on a surface of the lamella stack 700 and a base layer, such as the base layer 120, that is coupled to the columns and portions of the surfaces of the lamella stack 700 in gaps between the columns.

The lamella stack 700 includes lamellae 710, 720, and 730. Each of the lamellae 710, 720, and 730 has an orientation that is perpendicular to the orientation of its neighboring lamella or lamellae. The orientation of a lamella is an orientation of cross-linking in the lamella. Neighboring lamellae have perpendicular orientations. As shown in FIG. 7, the lamella 710 and 730 each has an orientation along the Y axis, and the lamella 720 has an orientation along the X axis. In some other embodiments, one or more of the lamellae can have an orientation along the Z axis. For instance, the lamellae 710 and 730 can have an orientation along the Z axis, or the lamellae 710 and 730 each has an orientation that is 90 degrees rotation about the Z axis. The structure of having multiple lamellae with different orientations can prevent moisture and/or gas penetration, result in better dimensional stability, minimize the chance of overlap or connections of pinholes within the lamellae, and achieve consistent mechanical strength across all directions.

The lamella stack 700 includes three lamellae 710, 720, and 730. In other embodiments, a lamella stack can have a different odd number of lamellae, such as five, seven, etc. An odd number of lamellae can avoid warping, as the lamella stack has high stiffness or rigidity in a direction perpendicular to the orientation of the top lamella. Taking the lamella stack 700 for example, it has high stiffness or rigidity along the X axis, which is perpendicular to the orientation of the lamella 710. In some embodiments, the top lamella and the bottom lamella have the same orientation, degree of cross-linking, and/or thickness. A lamella between the top and bottom lamellae can have a different thickness. A thickness of a lamella can be in a range from 1 nm to 1 µm. The top and bottom lamellae, such as the lamellae 710 and 730, can each have a thickness in a range from 10 nm to 1 µm. The intermediate lamellae, such as the lamella 720, can have a thickness in a range from 25 nm to 10 µm.

As shown in FIG. 7, the lamellae 710, 720, and 730 are separated by polymeric layers 740 and 750. Each polymeric layer includes a polymer material, which can be the same polymer material of the base layer of the flexible polymeric film. The lamellae 710, 720, and 730 can be generated by cross-linking molecules of the polymer material. In some embodiments, the lamellae 710, 720, and 730 can have different degrees of cross-linking. The polymeric layers 740 and 750 provide mechanical flexibility. They also function as barriers for gas and moisture permeation from the ambient. The lamella stack 700 may include two polymeric layers 740 and 750, or it may form with lamellae without the polymeric layers 740 and 750 if the lamellae have mechanical flexibilities. In other embodiments, a lamella stack can have a different even number of polymeric layers, such as four, six, etc. The top and bottom polymeric layers can be produced through the same process, and they can have same physical properties such as thickness and chemical composition. A thickness of a polymeric layer can be in a range from 1 nm to 1 µm. The top and bottom polymeric layers can have a thickness in a range from 10 nm to 1 µm, and the other polymeric layers can have a thickness in a range from 1 nm to 100 nm.

Chemical bonds can be formed in each polymeric layer and the lamellae neighboring the polymeric layer. Examples of the chemical bonds include —(C=C)—, —(C≡C)—, —(C=N)—, —(C≡N), —(C—S)—, —(C=S), —(S—S)—, —(S=N)—, (S=S), (S=O), -(M-O)—, -(M=O), -(M=N)—, and -(M≡C)—, where M is a metal atom, e.g., Al, Zr, Sn, Ti, Ni, Ag, Cu, Mn, Co, Zn, In, Ga, etc.

Figure 8:
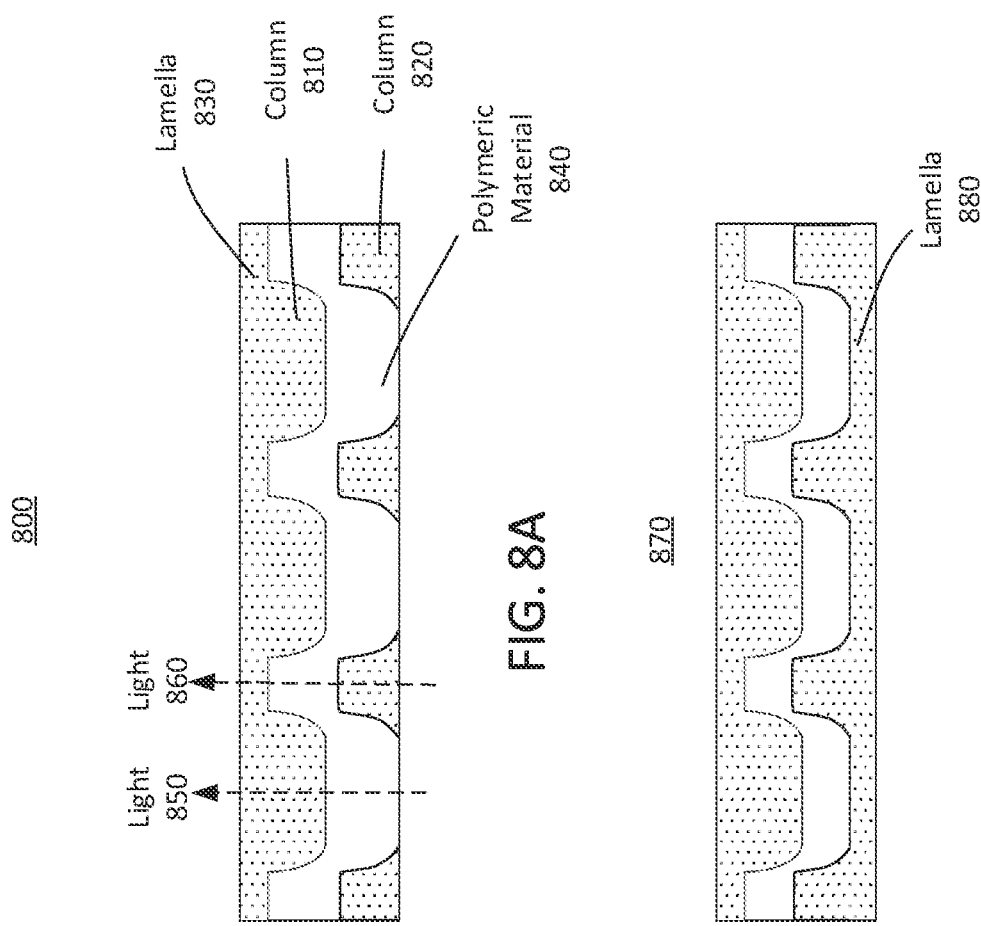
FIG. 8A is a cross-sectional view of a flexible polymeric film including two sets of columns, in accordance with an embodiment.
FIG. 8B is a cross-sectional view of another flexible polymeric film including two sets of columns, in accordance with an embodiment.

FIG. 8A is a cross-sectional view of a flexible polymeric film 800 including two sets of columns 810 and 820, in accordance with an embodiment. An embodiment of the columns 810 can be the columns 140. The columns 810 are on a surface of a lamella 830. An embodiment of the lamella 830 can be the lamella 130 illustrated in FIGS. 1A and 1B. The gaps between the columns 810 and the gaps between the columns 820 are filled with a polymeric material 850. The columns 810 and 820 can be formed through cross-linking of molecules of the polymeric material 840. The columns 810 and 820 have higher degree of cross-link than the gas, and therefore have different optical properties from the gaps.

The columns 820 have a reverse shape of the columns 810. As shown in FIG. 8A, each gap between the columns 820 is below a column 810, and each column 820 is below a gap between the columns 810. The columns 820 can reduce optical distortions caused by the columns 810. Taking light 850 and 860 for example, they both go through the flexible polymeric film 800 from bottom to top but go through different portions of the flexible polymeric film 800. The light 850 goes through a gap between two columns 820, a column 810, and the lamella 830. The light 860 goes through a column 820, a gap between two columns 810, and the lamella 830. But with the design of the flexible polymeric film 800, both light 850 and 860 go through a column, a gap, and the lamella 830. The flexible polymeric film 800 can be placed on top of a display screen as a protective cover and it does not cause (or it can minimize) optical distortions in images presented by the display screen.

FIG. 8B is a cross-sectional view of another flexible polymeric film 870 including two sets of columns, in accordance with an embodiment. In addition to the components of the flexible polymeric film 800, the flexible polymeric film 870 also includes another lamella 880, on which the columns 820 are arranged. Like the flexible polymeric film 800, the flexible polymeric film 870 does not cause optical distortions.

Figure 9:
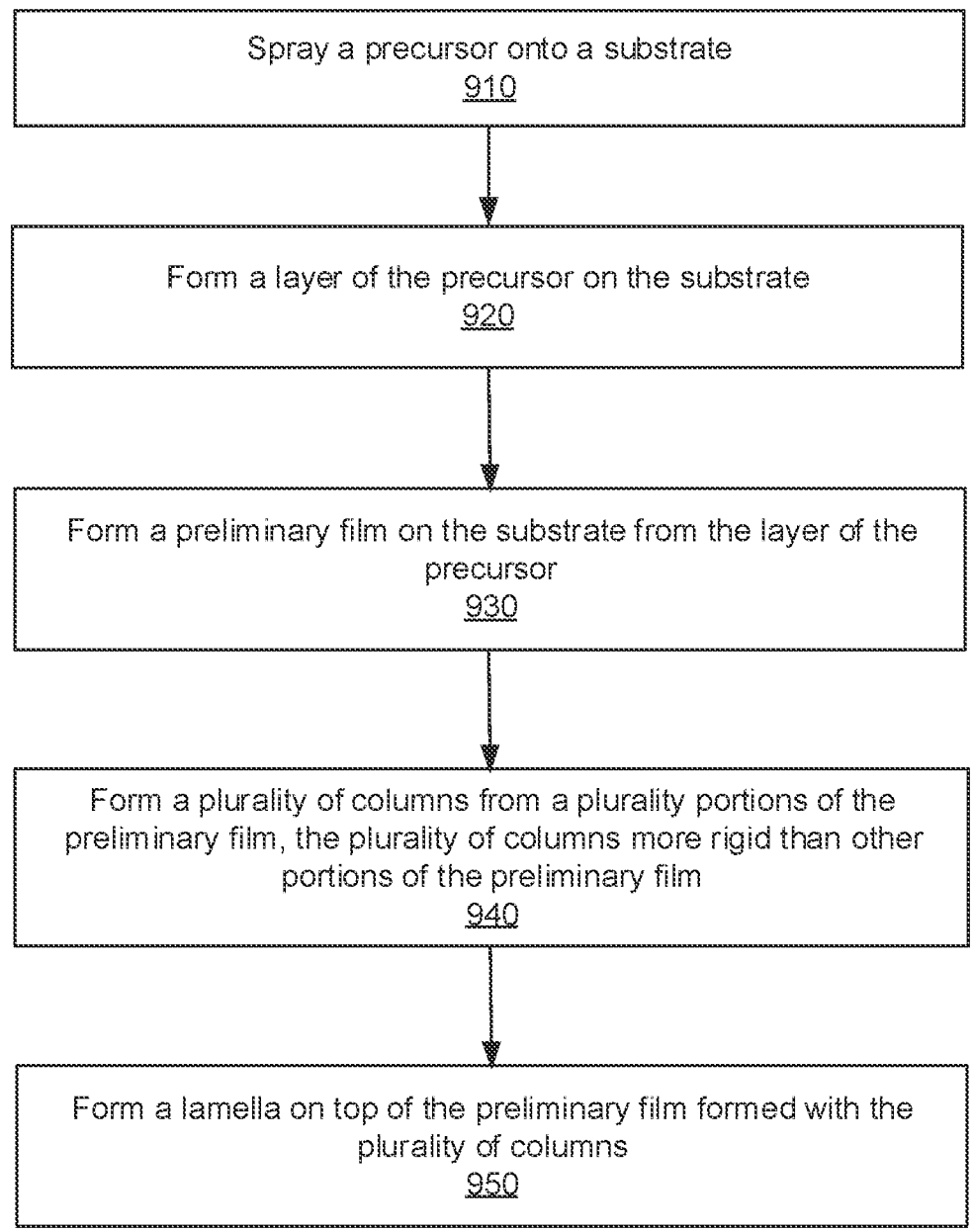
FIG. 9 is a flow chart illustrating a method for producing a flexible polymeric film, in accordance with an embodiment.

FIG. 9 is a flow chart illustrating a method for producing a flexible polymeric film, in accordance with an embodiment. The method can be performed by the film forming apparatus 300 in FIG. 3. The method may include different or additional steps than those described in conjunction with FIG. 9 in some embodiments or perform steps in different orders than the order described in conjunction with FIG. 9.

The film forming apparatus 300 sprays 910 a precursor onto a substrate. The precursor is a mixture of an organic precursor and a metal-organic precursor. A layer of the precursor is formed 920 on the substrate.

The film forming apparatus 300 forms 930 a preliminary film on the substrate from the layer of the precursor. In some embodiments, the preliminary film is formed by exposing the layer of the precursor to an energy beam, such as plasma radicals, laser beam, e-beam, and/or UV. For example, the layer of the precursor is solidified by the energy beam, for example, through chemical reactions between the plasma radicals and the precursor. In some other embodiments, the preliminary film is formed by spraying an additional precursor onto the layer of the precursor to form a layer of the additional precursor and exposing the layer of the additional precursor to an energy beam. In yet some other embodiments, the preliminary film is formed by exposing the layer of the precursor to plasma radicals to form an initial film, spraying an additional precursor onto the initial film to form a layer of the additional precursor, and exposing the layer of the additional precursor to an energy beam.

The film forming apparatus 300 forms 940 a plurality of columns from a plurality of portions of the preliminary film. The plurality of columns is more rigid than other portions of the preliminary film. The film forming apparatus 300 can form the columns through cross-linking molecules of one or more materials of the preliminary film. In some embodiments, the film forming apparatus 300 exposes the plurality of portions of the preliminary film to an energy beam to transform the plurality of portions of the preliminary film to the plurality of columns.

The film forming apparatus 300 forms 950 a lamella on top of the preliminary film formed with the plurality of columns. In some embodiments, the film forming apparatus 300 sprays a second precursor onto the preliminary film formed with the plurality of columns. A layer of the second precursor is formed on top of the preliminary film formed with the plurality of columns. The film forming apparatus 300 exposes the layer of the second precursor to a energy beam to transform the layer of the second precursor to the lamella. In some embodiments, the film forming apparatus 300 exposes the preliminary film formed with the plurality of columns to plasma radicals, laser, or electrons to transform a top portion of the preliminary film formed with the plurality of columns to the lamella.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method for producing a flexible polymeric film, the method comprising:
   forming a film on a substrate;
   forming a plurality of first columns and a plurality of second columns from a plurality of portions of the film, the plurality of first columns more rigid than other portions of the film, each of the plurality of first columns separated from a neighboring first column by a gap, the plurality of second columns having a reverse shape of the plurality of first columns, each of the plurality of second columns below the gap between two first columns of the plurality of first columns for reducing optical distortions caused by the plurality of first columns; and
   forming a lamella on the film.

2. The method of claim 1, wherein forming the plurality of first columns and the plurality of second columns from the plurality of portions of the film comprises:
   forming the plurality of first columns through cross-linking molecules of one or more materials of the film.

3. The method of claim 1, wherein forming the plurality of first columns and the plurality of second columns from the plurality of portions of the film comprises:
exposing the plurality of portions of the film to plasma radicals, laser, electron beams, or ultraviolet.

4. The method of claim 1, wherein forming the plurality of first columns and the plurality of second columns from the plurality of portions of the film comprises:
exposing the plurality of portions of the film to plasma radicals having a first power; and
exposing the other portions of the film to plasma radicals having a second power, the second power lower than the first power.

5. The method of claim 1, wherein forming the plurality of first columns and the plurality of second columns from the plurality of portions of the film comprises:
exposing the plurality of portions of the film to a first type of plasma radicals; and
exposing the other portions of the film to a second type of plasma radicals, the second type of plasma radical different from the first type of plasma radicals.

6. The method of claim 1, wherein forming the lamella on the film comprises:
spraying a second precursor onto the film;
forming a layer of the second precursor on the film; and
exposing the layer of the second precursor to an energy beam to transform the layer of the second precursor to the lamella.

7. The method of claim 1, wherein forming the lamella on the film comprises:
exposing the film to plasma radicals, laser, or electrons to transform a portion of the film formed with the plurality of first columns to the lamella.

8. The method of claim 1, wherein forming the film on the substrate comprises:
spraying a precursor onto the substrate; and
forming the film from a layer of the precursor on the substrate.

9. The method of claim 8, wherein forming the film from the layer of the precursor on the substrate comprises:
exposing the layer of the precursor to an energy beam to form the film on the substrate.

10. The method of claim 8, wherein forming the film on the substrate further comprises:
spraying an additional precursor onto the layer of the precursor to form a layer of the additional precursor on the layer of the precursor.

11. The method of claim 10, wherein forming the film on the substrate further comprises:
exposing the layer of the additional precursor to an energy beam to form the film on the substrate.

12. The method of claim 8, wherein forming the film on the substrate comprises:
exposing the layer of the precursor to an energy beam to form an initial film;
spraying an additional precursor onto the initial film to form a layer of the additional precursor; and
exposing the layer of the additional precursor to an energy beam to form the film on the substrate.

13. The method of claim 1, further comprising:
forming an additional lamella on which the plurality of second columns are arranged.

14. The method of claim 1, wherein the other portions of the film are less rigid than the plurality of second columns.

15. The method of claim 1, wherein a width of each of the plurality of first columns is larger than a width of each of the gaps.

16. The method of claim 1, wherein a width of each of the plurality of first columns is at most 500 nanometers.

17. The method of claim 1, wherein a width of each of the gaps is at most 250 nanometers.

18. The method of claim 1, wherein a thickness of the lamella is from 100 nanometers to 20 micrometers.

19. The method of claim 1, wherein a ratio of a thickness of each of the plurality of first column to a thickness of the lamella is equal to or larger than 10.

20. The method of claim 1, further comprising:
forming a passivation layer having a higher elasticity than the film, the passivation layer arranged on a first surface of the lamella that opposes a second surface of the lamella where the plurality of first columns are.

* * * * *